(12) United States Patent
Okamoto et al.

(10) Patent No.: US 9,621,279 B2
(45) Date of Patent: Apr. 11, 2017

(54) OPTICAL RECEIVER CIRCUIT

(71) Applicants: NEC Corporation, Tokyo (JP); FUJITSU LIMITED, Kanagawa (JP)

(72) Inventors: Daisuke Okamoto, Tokyo (JP); Junichi Fujikata, Tokyo (JP); Tatsuya Usuki, Kanagawa (JP)

(73) Assignees: NEC CORPORATION, Tokyo (JP); FUJITSU LIMITED, Kanagawa (JP)

( * ) Notice: Subject to any disclaimer, the term of this patent is extended or adjusted under 35 U.S.C. 154(b) by 0 days.

(21) Appl. No.: 14/780,791

(22) PCT Filed: Feb. 4, 2014

(86) PCT No.: PCT/JP2014/052984
§ 371 (c)(1),
(2) Date: Sep. 28, 2015

(87) PCT Pub. No.: WO2014/156336
PCT Pub. Date: Oct. 2, 2014

(65) Prior Publication Data
US 2016/0056900 A1    Feb. 25, 2016

(30) Foreign Application Priority Data

Mar. 27, 2013 (JP) .................................. 2013-065997

(51) Int. Cl.
*H04B 10/67* (2013.01)
*H04B 10/69* (2013.01)
(Continued)

(52) U.S. Cl.
CPC ............. *H04B 10/697* (2013.01); *H03F 3/08* (2013.01); *H04B 10/0795* (2013.01); *H04B 10/693* (2013.01); *H04L 25/085* (2013.01)

(58) Field of Classification Search
CPC .......................... H04B 10/676; H04B 10/677
See application file for complete search history.

(56) References Cited

U.S. PATENT DOCUMENTS 4,785,167 A    11/1988 Madrid
5,013,903 A  *  5/1991 Kasper ............... H04B 10/6973
                                                   250/214 A
(Continued)

FOREIGN PATENT DOCUMENTS

JP        64-69924     3/1989
JP        06-177663    6/1994
(Continued)

OTHER PUBLICATIONS

Filip Tavernier and Michiel Steyaert, "A 5.5 Gbit/s Optical Receiver in 130 nm CMOS with Speed-Enhanced Integrated Photodiode", 2010 Proceedings of the ESSCIRC, pp. 542-545 (Fig.1).
(Continued)

*Primary Examiner* — Shi K Li
(74) *Attorney, Agent, or Firm* — Young & Thompson

(57) ABSTRACT

An optical receiver circuit has a function of converting a differential optical signal into a differential current signal. The optical receiver circuit has a pair of light-receiving elements including first and second light-receiving elements operable to convert an optical signal into a current signal and a pair of signal lines. An anode of the first light-receiving element and a cathode of the second light-receiving element are connected to a first signal line of the pair of signal lines via first and second AC coupling capacitors, respectively. A cathode of the first light-receiving element and an anode of the second light-receiving element are connected to a second signal line of the pair of signal lines via third and fourth AC coupling capacitors, respectively. Differential signal currents are generated in the first and second signal lines in response to reception of differential optical signals inputted into the first and second light-receiving elements.

18 Claims, 9 Drawing Sheets

(51) Int. Cl.
*H03F 3/08* (2006.01)
*H04B 10/079* (2013.01)
*H04L 25/08* (2006.01)

(56) References Cited

U.S. PATENT DOCUMENTS

| | | | |
|---|---|---|---|
| 5,130,776 A | * | 7/1992 | Popovic ............ H01L 31/02019 |
| | | | 257/461 |
| 2006/0072927 A1 | * | 4/2006 | Kim ....................... H04B 10/67 |
| | | | 398/214 |
| 2008/0240735 A1 | * | 10/2008 | Bossard .................... H03F 1/08 |
| | | | 398/202 |
| 2010/0284703 A1 | | 11/2010 | Suzuki |
| 2014/0070351 A1 | * | 3/2014 | Masuyama ....... H01L 31/02325 |
| | | | 257/432 |

FOREIGN PATENT DOCUMENTS

| | | |
|---|---|---|
| JP | 06-224652 | 8/1994 |
| JP | 2008-010991 | 1/2008 |
| JP | 2011-119855 | 6/2011 |
| WO | 2009069814 | 6/2009 |

OTHER PUBLICATIONS

International Search Report PCT/JP2014/052984 dated Apr. 15, 2014.

\* cited by examiner

OPTICAL RECEIVER CIRCUIT

TECHNICAL FIELD

The present invention relates to a highly sensitive optical receiver circuit used in an optical communication system or an optical information processing system.

BACKGROUND ART

The amount of information to be handled by devices such as servers or routers is rapidly increasing along with popularization of the Internet and the like. The transmission capacity of signals communicated between semiconductor parts such as LSIs in those devices is expected to continue to grow quickly. On the other hand, problems such as increased power consumption, delayed signal transmission, lowered reliability of signal lines, and signal interference are becoming serious in the conventional electric wiring technology. In order to solve those problems, application of optical wiring is being examined for various transmission distances from a long-distance transmission to a short-distance transmission between chips or within a chip.

Optical receiver circuits that are highly sensitive, are small in size, and consume low electric power are important in optical information transmission. As disclosed in Patent Literature 1 and Patent Literature 2, there has been proposed an optical receiver circuit in which capacitors for AC (alternate current) coupling are connected to an anode and a cathode of one light-receiving element to generate a set of signal currents in two signal lines and output it to a subsequent TIA (transimpedance amplifier) circuit. With the AC coupling, a bias voltage of the light-receiving element can be determined independently of the TIA circuit. Furthermore, DC components can be removed to extract only signal components. Non-Patent Literature 1 discloses an optical receiver circuit in which two light-receiving elements are connected to a subsequent TIA circuit via respective AC coupling capacitors.

PRIOR ART LITERATURE

Patent Literature

Patent Literature 1: JP H06-224652 A
Patent Literature 2: JP 2011-119855 A

Non-Patent Literature

Non-Patent Literature 1: F. Tavernier and M. Steyaert, A 5.5 Gbit/s Optical Receiver in 130 nm CMOS with Speed-Enhanced Integrated Photodiode, 2010 Proceedings of the ESSCIRC, pp. 542-545 (FIG. 1).

SUMMARY OF THE INVENTION

Problem(s) to be Solved by the Invention

The configuration disclosed in Patent Literature 1 or Patent Literature 2 cannot receive differential optical signals because signals subjected to on-off keying are received by one light-receiving element. Thus, influences of noises generated in an optical sending part or an optical transmitting part cannot be cancelled. Therefore, there has been a problem that the receiving sensitivity is lowered. The optical receiver circuit of Non-Patent Literature 1 uses two light-receiving elements to receive differential optical signals so as to cancel the noise. However, a differential amplitude of the signal currents is not improved. Therefore, the optical receiver circuit of Non-Patent Literature 1 has difficulty in enhancing the sensitivity.

An optical receiver circuit shown in FIG. 1 will be described in Patent Literature 1 or Patent Literature 2 and will be mentioned as Related Art 1. The optical receiver circuit of FIG. 1 receives signals subjected to on-off keying with one light-receiving element. Therefore, the optical receiver circuit cannot receive differential optical signals. Thus, influences of noises generated in an optical sending part or an optical transmitting part cannot be cancelled, so that the receiving sensitivity is lowered. FIG. 2 shows an example of waveforms of signal currents when an photoelectric current having an amplitude of 100 µA is generated in the light-receiving element 1. A signal current $I_1$ flows through a first signal line, and a signal current $I_2$ flows through a second signal line. At that time, a differential signal ($I_{diff}=I_1-I_2$) has an amplitude of 200 µA.

The optical receiver circuit of Non-Patent Literature 1 will be described with use of an optical receiver circuit shown in FIG. 3. The optical receiver circuit of FIG. 3 uses two light-receiving elements to receive differential optical signals. As a result, noises can be cancelled. However, as shown in an example of waveforms of FIG. 4, when an photoelectric current having an amplitude of 100 µA is generated in the light-receiving elements 1, the signal current has a differential amplitude of 200 µA as in the case of Related Art 1. Accordingly, no improvement is exhibited as compared to Related Art 1. Thus, a difficulty has been found out to obtain a high sensitivity.

Under those circumstances, an object of the present invention is to provide an optical receiver circuit capable of obtaining a greater signal current and improving the receiving sensitivity.

Means for Solving the Problem(s)

According to an embodiment of the present invention, there is provided an optical receiver circuit having a function of converting a differential optical signal into a differential current signal, characterized by comprising a pair of light-receiving elements including first and second light-receiving elements operable to convert an optical signal into a current signal and a pair of signal lines, wherein an anode of the first light-receiving element and a cathode of the second light-receiving element are connected to a first signal line of the pair of signal lines via first and second AC coupling capacitors, respectively, a cathode of the first light-receiving element and an anode of the second light-receiving element are connected to a second signal line of the pair of signal lines via third and fourth AC coupling capacitors, respectively, and differential signal currents are generated in the first and second signal lines in response to reception of differential optical signals inputted into the first and second light-receiving elements.

According to another embodiment of the present invention, there is provided an optical receiver circuit having a function of converting a differential optical signal into a differential current signal, characterized by comprising a pair of light-receiving elements including first and second light-receiving elements operable to convert an optical signal into a current signal and a pair of signal lines, wherein a cathode of the first light-receiving element and an anode of the second light-receiving element are connected to each other via a first AC coupling capacitor, the cathode of the first light-receiving element is connected to a first signal line of the pair of signal lines, an anode of the first light-receiving element and a cathode of the second light-receiving element are connected to each other via a second AC coupling capacitor, the cathode of the second light-receiving element is connected to a second signal line of the pair of signal lines, and differential signal currents are generated in the first and second signal lines in response to reception of differential optical signals inputted into the first and second light-receiving elements.

Advantageous Effects of the Invention

According to an embodiment of the present invention, a great differential amplitude can be obtained, and a highly sensitive optical receiver circuit can be achieved.

BRIEF DESCRIPTION OF DRAWINGS

In FIG. 8, (a) is a top view, (b) is a cross-sectional view taken along line AA' of (a), (c) is a cross-sectional view taken along line BB', and (d) is a cross-sectional view taken along like CC'.

MODE(S) FOR CARRYING OUT THE INVENTION

Figure 1:
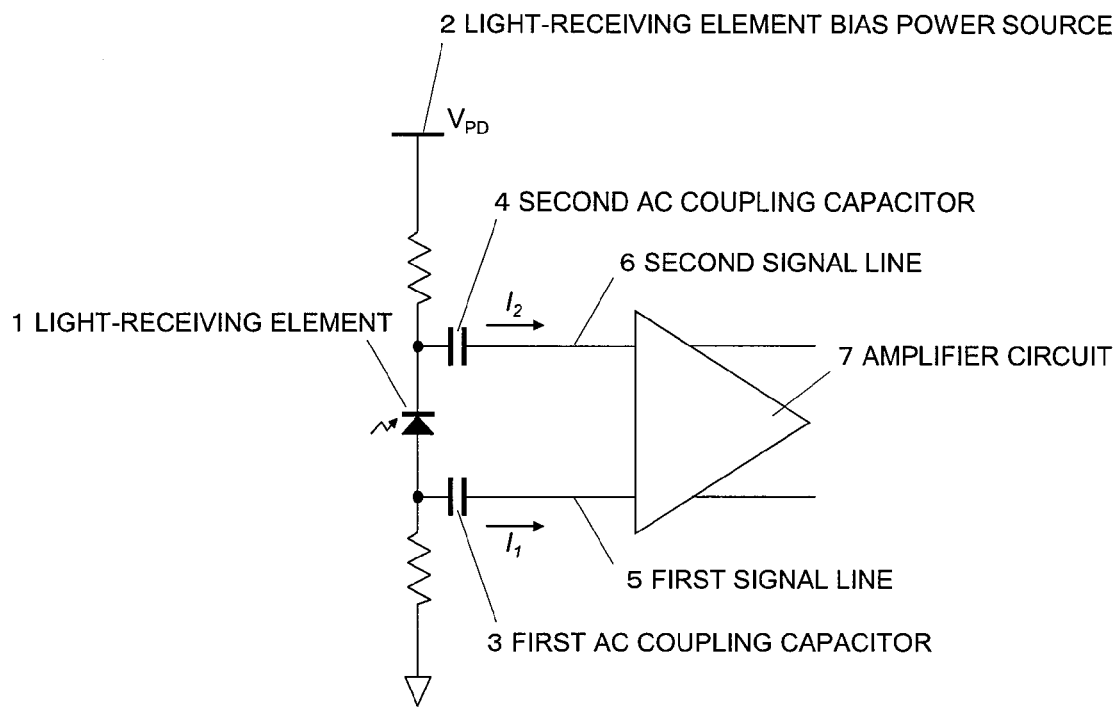
FIG. 1 shows an optical receiver circuit of Related Art 1.
Figure 2:
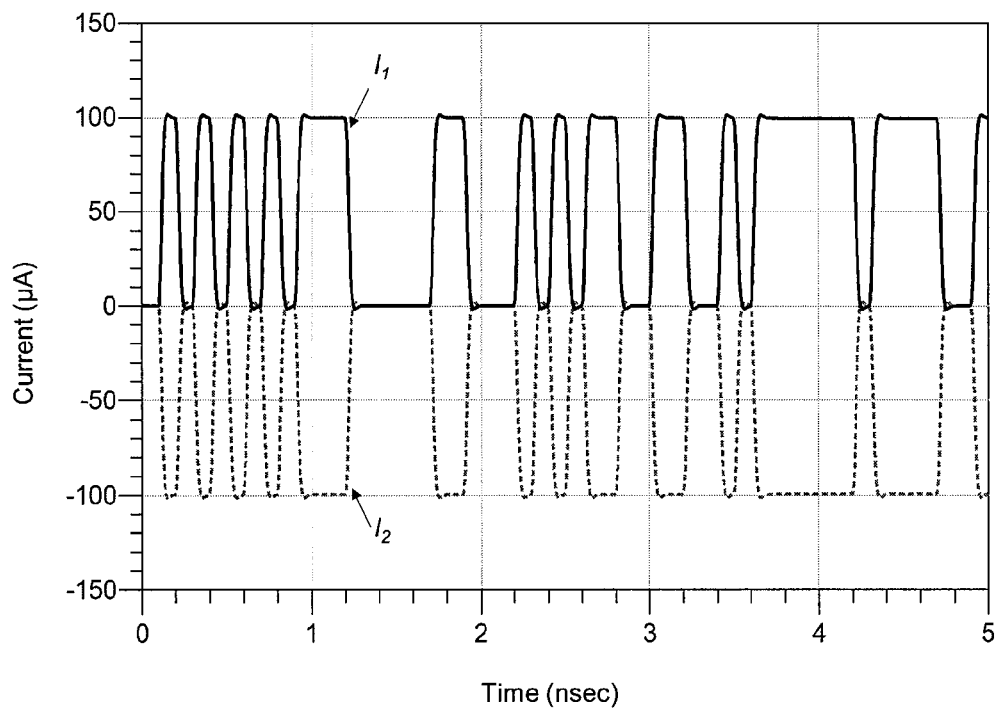
FIG. 2 is a diagram showing an example of waveforms of the optical receiver circuit shown in FIG. 1.

Next, embodiments of the present invention will be described below with reference to the accompanying drawings. In the description of the embodiments, components having the same function are denoted by the same reference numerals, and the explanation of such components may be omitted.

(Embodiment 1)

Figure 5:
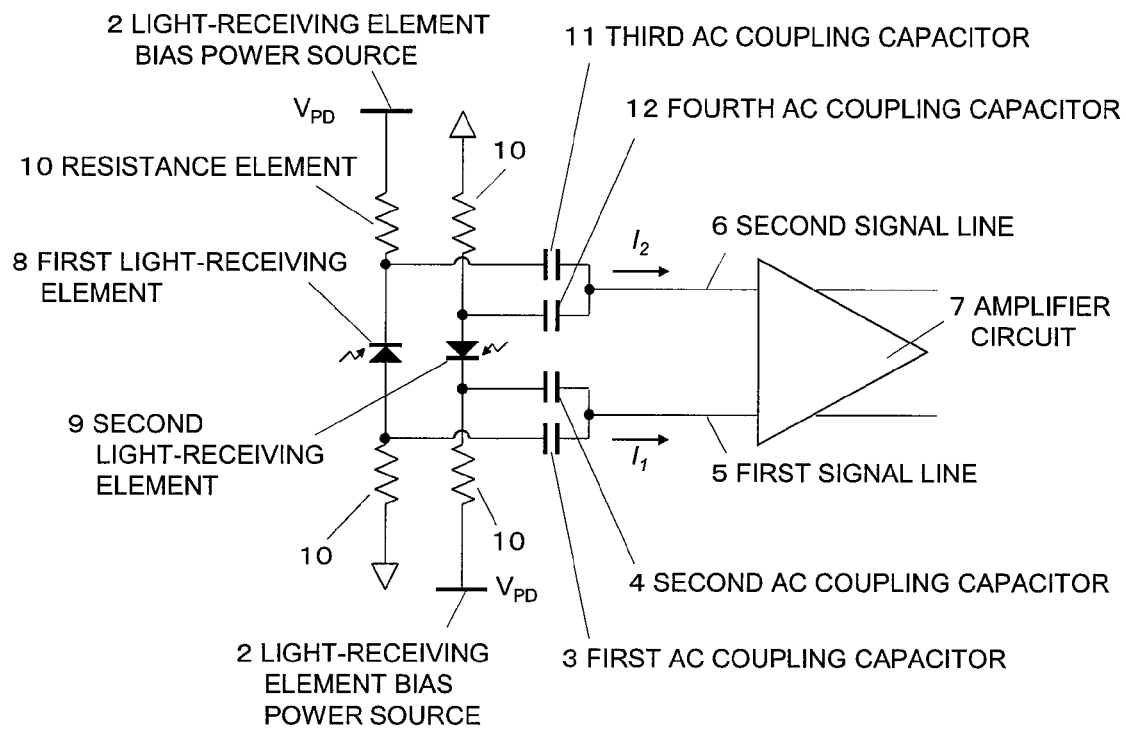
FIG. 5 is an optical receiver circuit diagram according to a first embodiment of the present invention.

FIG. 5 shows an optical integrated circuit according to a first embodiment of the present invention. Each of a first light-receiving element 8 and a second light-receiving element 9 (a photodiode or a photoconductor such as a PIN diode, an avalanche PD, or an MSM (metal-semiconductor-metal) diode, a phototransistor, or the like) has an anode connected to the ground via a resistance element 10. A cathode of each of the first light-receiving element 8 and the second light-receiving element 9 is connected to a light-receiving element bias power source 2 via a resistance element 10. A reverse bias voltage is applied to the first light-receiving element 8 and the second light-receiving element 9. The anode of the first light-receiving element 8 and the cathode of the second light-receiving element 9 are coupled to each other via a first AC coupling capacitance 3 and a second AC coupling capacitance 4 and then connected to a first signal line 5. Furthermore, the cathode of the first light-receiving element 8 and the anode of the second light-receiving element 9 are coupled to each other via a third AC coupling capacitance 11 and a fourth AC coupling capacitance 12 and then connected to a second signal line 6. A differential optical signal is inputted into the first light-receiving element 8 and the second light-receiving element 9. Here, the differential optical signal is formed by a first optical signal and a second optical signal which have phases reverse to each other. Specifically, the differential optical signal indicates such a signal that the second optical signal takes a low level when the first optical signal is at a high level and that the second optical signal takes a high level when the first optical signal is at a low level. The method of generating a differential optical signal is not limited to a specific one. For example, a differential optical signal can be generated by using an optical modulator including a Mach-Zehnder interferometer with two ports of output. The first optical signal is inputted into the first light-receiving element, whereas the second optical signal is inputted into the second light-receiving element. Thus, differential current signals having reversed phases are generated at the respective light-receiving elements.

Figure 6:
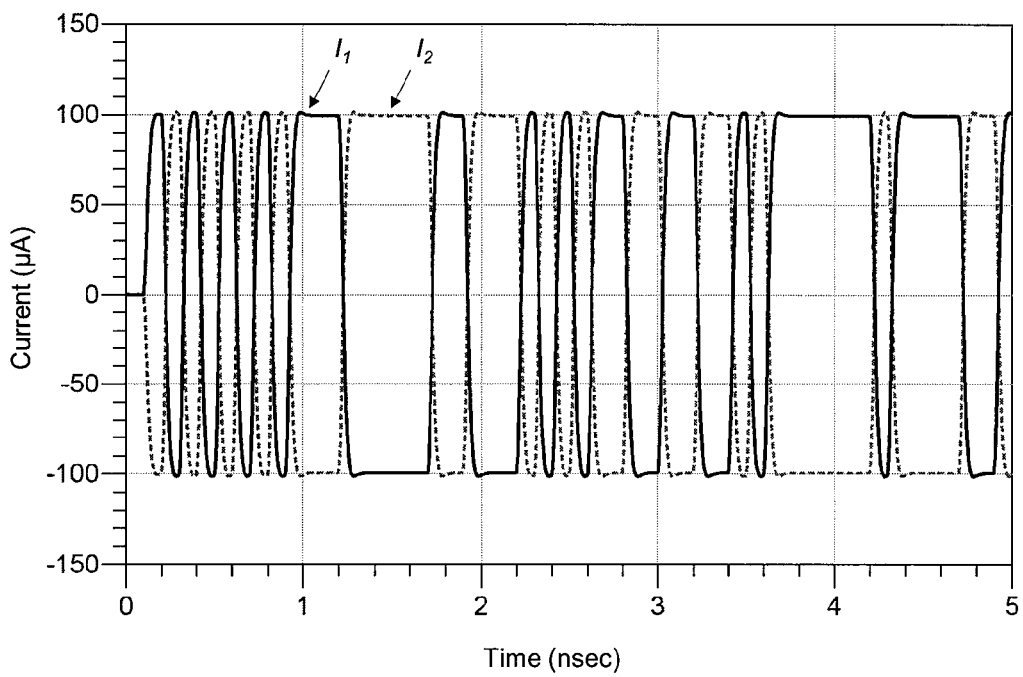
FIG. 6 is a diagram showing an example of waveforms of the optical receiver circuit diagram in the first embodiment of the present invention.

When a differential optical signal is inputted into the first light-receiving element 8 and the second light-receiving element 9, a differential photoelectric current is generated. Thus, a differential signal current from which DC components have been removed flows through the first signal line 5 and the second signal line 6 via the respective AC coupling capacitances. More specifically, when a photoelectric current I flows through the first light-receiving element 8, a signal current $I_1$ flowing through the first signal line 5 is equal to I, and a signal current $I_2$ flowing through the second signal line 6 is equal to −I. When a photoelectric current I flows through the second light-receiving element 9, $I_1$=−I and $I_2$=I. Since a differential optical signal is inputted into the respective light-receiving elements, a differential signal current of $I_1$ and $I_2$ is generated. The differential signal current is inputted into an amplifier circuit 7, amplified therein, and outputted to a subsequent logical circuit or the like. For example, the amplifier circuit 7 is formed by a transimpedance amplifier circuit operable to convert a current into a voltage and perform amplification. The configuration of the amplifier circuit 7 is not limited to a specific one. Various amplifier circuits other than a transimpedance amplifier circuit may also be used. For example, a CMOS inverter may be used to form the amplifier circuit 7. FIG. 6 shows an example of waveforms in a case where a photoelectric current having an amplitude of 100 μA is generated at the first light-receiving element 8 and the second light-receiving element 9 in the present embodiment. At that time, the amplitude of $I_1$ and $I_2$ is 200 μA. Thus, the amplitude of the differential signal ($I_{diff}$=$I_1$−$I_2$) becomes 400 μA. In order words, the signal thus obtained has twice the amplitude obtained in the case of Related Art 1 and Non-Patent Literature 1, so that a highly sensitive optical receiver circuit can be achieved.

The differential operation can remove noises generated at an optical transmitter part, optical crosstalk noises, or stray light components generated with the same phase on two optical transmission lines. Therefore, the receiving sensitivity is advantageously improved. Furthermore, a symmetric arrangement of a power source, a circuit configuration, or a wiring structure makes it possible to keep the differential signal currents generated on the two signal lines in a symmetric form. More specifically, the first to fourth AC coupling capacitances are arranged to have almost the same capacity. The resistance elements 10 connected to the first and second light-receiving elements are also arranged to have almost the same resistance value. Thus, the symmetry can be maintained. Nevertheless, the present invention is not limited to this example.

FIG. 5 illustrates an optical receiver circuit having an arrangement using two light-receiving elements. However, the number of the light-receiving elements is not limited to two. The optical receiver circuit may be configured with a larger number of light-receiving elements. For example, a plurality of pairs of light-receiving elements having different wavelength sensitivities may be formed, and the pairs of the light-receiving element to which differential optical signals are inputted may be switched according to an input wavelength. Thus, an optical receiver circuit that can handle a wider range of wavelengths can be provided.

Optimal semiconductor material or composition of the semiconductor substrate to form an optical receiver circuit according to the present invention can properly be selected depending upon a wavelength used or an application. For example, an Si substrate or an SOI (Silicon on Insulator) substrate, or a compound semiconductor substrate such as an InP substrate or a GaAs substrate may be used. When an Si substrate or an SOI substrate is used, a small-sized optical path can be formed by transmitting a differential optical signal by using an Si waveguide having a core of Si. The wavelength range of the signal light is not limited to a specific one. An optimal range may be used in consideration of the substrate material, a manufacturing process, and the like. The device structure and compositional materials of the light-receiving elements may be designed depending upon a wavelength used or an application. For example, when an optical receiver circuit is formed on an SOI substrate, $Si_xGe_{1-x}(0 \leq x \leq 1)$ formed on Si by epitaxial growth may be used as an absorbing layer to produce light-receiving elements. Either a surface incidence type or a waveguide incidence type may be used as a structure of coupling input beams. In the case of a waveguide incidence type using an optical waveguide, there are advantages in that the skew can be simply adjusted and that influence of variations in coupling efficiency can be reduced.

The capacitance of the AC coupling capacitors can properly be designed to be an optimal value in consideration of a differential photoelectric current value or the transmission protocol. Using the transmission protocol in which a mark rate is guaranteed and in which lower frequency components are relatively small, such as 8B10B or 64B66B makes it possible to reduce the coupling capacitance so that the receiver circuit can be reduced in size. Furthermore, the AC coupling capacitances can be provided with an optical or electrical crosstalk reduction function. Therefore, an optical receiver circuit having a higher sensitivity can be provided.

The resistance values of the resistance elements 10 can be designed in consideration of the reactance of the AC coupling capacitances so that a desired signal current flows through each of the signal lines. Furthermore, in FIG. 5, the same bias voltage is applied to the first light-receiving element 8 and the second light-receiving element 9, respectively. However, optimal bias voltages may be applied independently in consideration of variations in characteristics of the elements.

Moreover, the configuration of the amplifier circuit 7 is not limited to a specific one. An optimal circuit configuration may properly be used to amplify a differential signal. Specifically, the amplifier circuit 7 may be formed by a transimpedance amplifier circuit, a limiting amplifier circuit, a buffer circuit having a function of automatically adjusting a gain, or the like. For example, a CMOS (Complementary Metal Oxide Semiconductor) inverter may be used to form a transimpedance amplifier circuit. Within the optical receiver circuit according to the present invention, symmetric differential currents that are positive and negative can be obtained. An input amplitude which has an inverter threshold as a center is obtained and is effective to achieve good linearity and gain. Furthermore, symmetric rising/falling waveforms can be obtained so as to produce good eye pattern opening shapes.

The differential optical signals inputted to the first light-receiving element 8 and the second light-receiving element 9 can be generated by, for example, an optical modulator using a 2×2 Mach-Zehnder interferometer. It is preferable to equalize optical powers of the differential optical signals inputted to the two light-receiving elements in order to perform a symmetric operation. In a case where differential optical signal transfer is performed with use of an optical waveguide having different wire lengths, the material and dimension of the optical waveguide may be adjusted to equalize optical powers inputted to the light-receiving elements. A method of connecting each of the light-receiving elements to the amplifier circuit 7 is not limited to a specific one. The light-receiving elements and the amplifier circuit 7 may be monolithically integrated on the same semiconductor substrate. The light-receiving elements and the amplifier circuit 7 may be connected to each other by flip-chip mounting. Furthermore, the light-receiving elements and the amplifier circuit 7 may be connected to each other by wire bonding or the like. Chip condensers or the like may be mounted to form the respective AC coupling capacitances. The light-receiving elements and the amplifier circuit 7 may be formed on substrates made of different semiconductor materials and connected to each other. It is preferable to monolithically integrate the light-receiving elements and the amplifier circuit 7 because parasitic components of electric wiring parts or the like, such as a parasitic capacitance or a parasitic inductance, can be reduced, and, particularly, because the symmetry can readily be held by reduced variations. Furthermore, the optical receiver circuits according to the present invention can be arranged to form multiple channels on the same semiconductor substrate.

(Embodiment 2)

Figure 7:
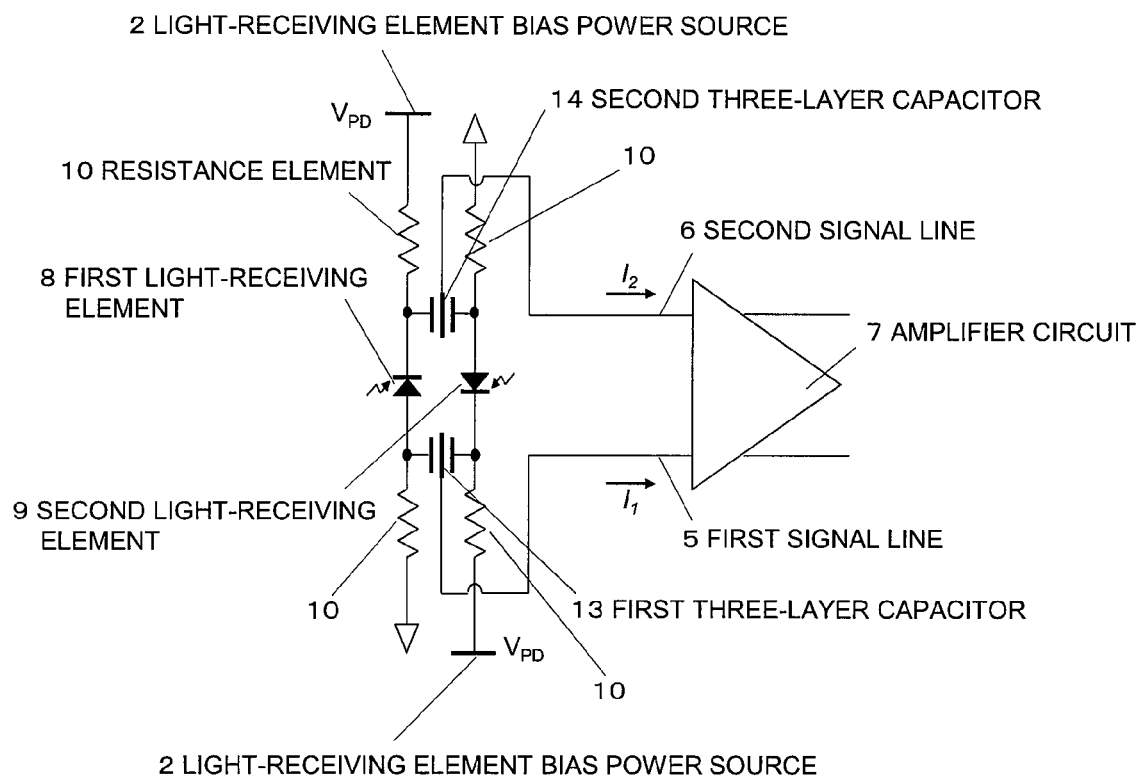
FIG. 7 is an optical receiver circuit diagram according to a second embodiment of the present invention.

FIG. 7 shows an optical receiver circuit according to a second embodiment of the present invention. A first light-receiving element 8 and a second light-receiving element 9 are coupled via a first three-layer capacitor 13 and a second three-layer capacitor 14. Intermediate electrodes of the three-layer capacitors are connected to a first signal line 5 and a second signal line 6, respectively. Although the optical receiver circuit of Embodiment 1 should have four AC coupling capacitors, the optical receiver circuit of Embodiment 2 is effective to reduce a planarl footprint of the device by using three-layer capacitors.

Figure 8:
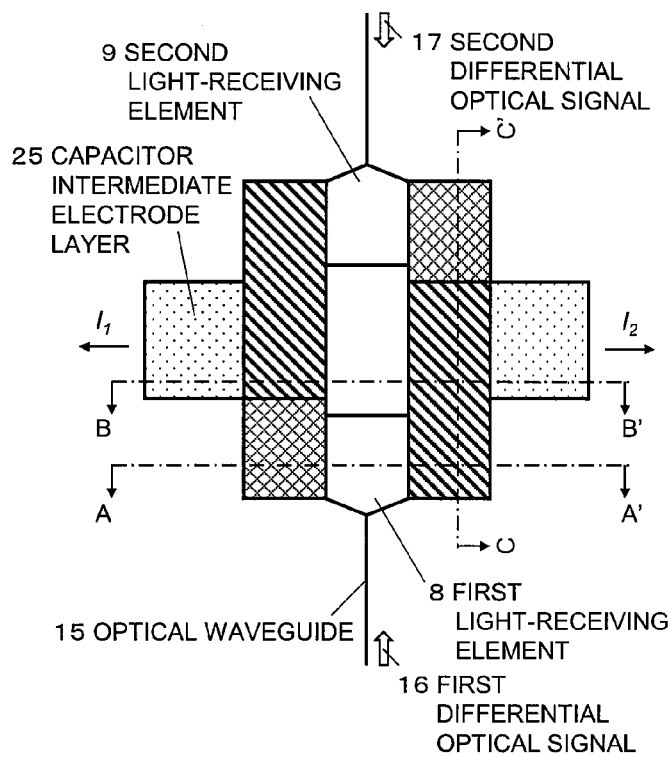
FIG. 8 shows device structure diagrams in the optical receiver circuit of the second embodiment of the present invention.
Figure 8:
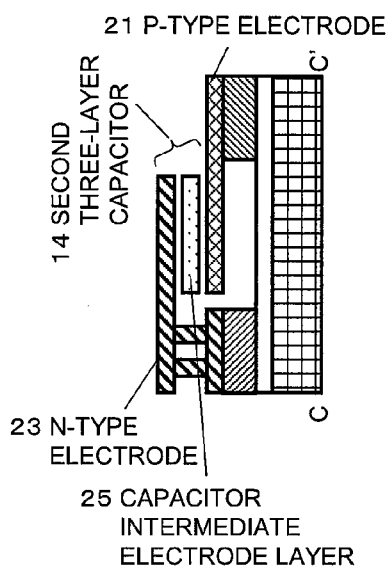
Figure 8:
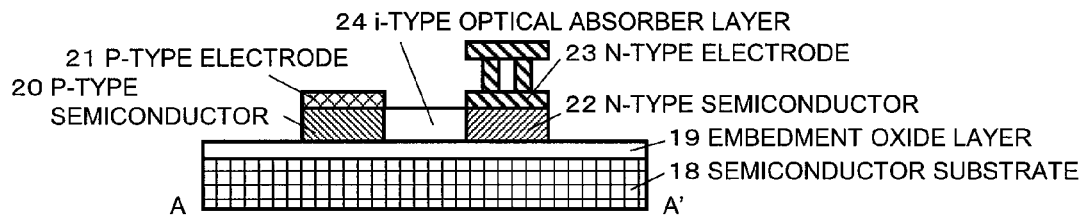
Figure 8:
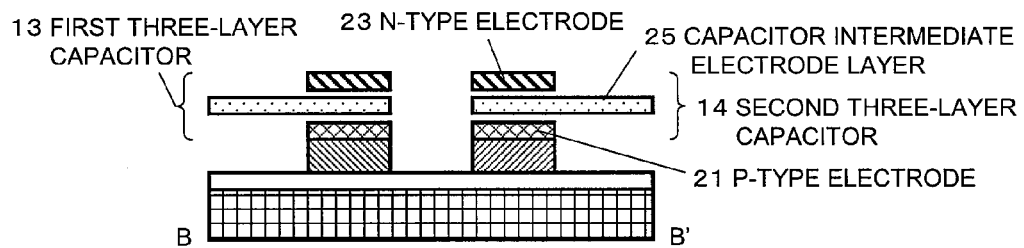

FIG. 8 shows device configuration diagrams of an example of the optical receiver circuit according to the present embodiment. Two light-receiving elements including a P-type semiconductor 20, an i-type optical absorber layer 24, and an N-type semiconductor 22 are formed on a semiconductor substrate 18 having an oxide layer 19 embedded into the semiconductor substrate 18. Each of the first three-layer capacitor 13 and the second three-layer capacitor 14 includes a P-type electrode 21, a capacitor intermediate electrode layer 25, and an N-type electrode 23. AC coupling is established between the P-type electrode of the first light-receiving element 8 and the N-type electrode of the second light-receiving element 9 through the first three-layer capacitor 13. Likewise, AC coupling is established between the N-type electrode of the first light-receiving element 8 and the P-type electrode of the second light-receiving element 9 through the second three-layer capacitor 14. A differential signal current is generated in the capacitor intermediate electrode layer 25 by a first differential optical signal 16 and a second differential optical signal 17 both of which are given through the optical waveguide 15 and which are incident on the first light-receiving element 8 and the second light-receiving element 9, respectively.

As shown in FIG. 8, this device configuration is advantageous in that differential signal currents held in symmetry can be generated because two light-receiving elements, two three-layer capacitors, and two electrodes are symmetrically arranged. More specifically, the symmetry can be held by configuring the first and second light-receiving elements to have the same layer arrangement, size, and shape, configuring the first and second three-layer capacitors to have the same layer arrangement, size, and shape, and configuring a wiring distance and a positional relationship between the first light-receiving element and the first three-layer capacitor to be equal to a wiring distance and a positional relationship between the second light-receiving element and the second three-layer capacitor. Furthermore, the P-type electrode of one of the light-receiving elements/three-layer capacitors and the N-type electrode of the other are arranged close to each other. Therefore, a parasitic capacitance can be reduced. The configuration of the three-layer capacitors and the light-receiving elements is not limited to this example. In consideration of restrictions imposed by a layout of an integrated circuit, the three-layer capacitors and the light-receiving elements may be arranged such that the symmetry can be held. Furthermore, when the capacitor intermediate electrode layers 25 are symmetrically extended in a direction perpendicular to the optical waveguide 15, the layout interference with optical wiring can be reduced while the symmetry is held.

The light-receiving element bias power sources 2 and the resistance elements 10 are omitted from FIG. 8. As shown in FIG. 7, the P-type electrodes 21 are practically connected to the ground via the resistance elements 10, and the N-type electrodes 23 are connected to the light-receiving element bias power sources 2.

(Embodiment 3)

Figure 9:
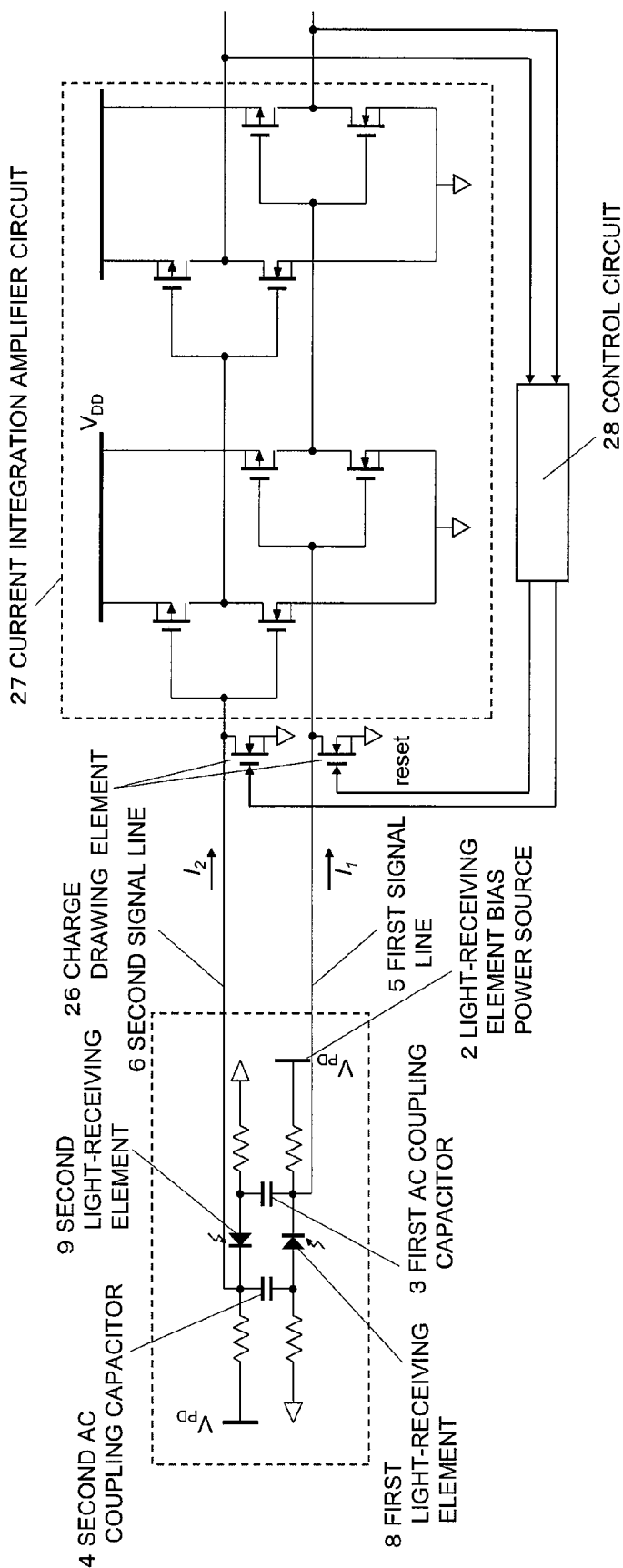
FIG. 9 is an optical receiver circuit diagram according to a third embodiment of the present invention.

FIG. 9 shows an optical receiver circuit according to a third embodiment of the present invention. This embodiment somewhat differs from the first embodiment in configuration of connection between a pair of light-receiving elements. In FIG. 9, the pair of light-receiving elements includes a first light-receiving element 8 and a second light-receiving element 9. A plurality of AC coupling capacitors includes a first AC coupling capacitor 3 and a second AC coupling capacitor 4. An anode of the first light-receiving element and a cathode of the second light-receiving element are connected to each other at the second AC coupling capacitor 4. The cathode of the second light-receiving element is connected to a second signal line 6. Furthermore, a cathode of the first light-receiving element and an anode of the second light-receiving element are connected to each other at the first AC coupling capacitor 3. The cathode of the first light-receiving element is connected to a first signal line 5. When differential optical signals are inputted into the first and second light-receiving elements, differential signal currents are generated in the first and second signal lines. This embodiment differs from the first embodiment in configuration of connection between the pair of the light-receiving elements to some extent. As with the first embodiment, however, the present embodiment can obtain an input current twice that obtained by the receiver circuits of Related Art 1 and Non-Patent Literature 1. Therefore, more highly sensitive detection can be achieved.

Differential currents generated in the first signal line 5 and the second signal line 6 are supplied to a current integration amplifier circuit 27. The current integration amplifier circuit 27 is an example of the amplifier circuit 7 shown in FIG. 5 that is other than a transimpedance amplifier circuit. The current integration amplifier circuit 27 can perform signal amplification on the differential currents generated in the first signal line 5 and the second signal line 6. For example, highly sensitive detection can be achieved by accumulating charges in a gate of a CMOS inverter. An output voltage from the current integration amplifier circuit 27 may be monitored so that a control circuit 28 performs feedback control. Inputted integration charges are drawn to conduct a reset operation by using charge drawing elements 26. Thus, 0/1 determination can be made for each bit. The optical receiver circuit according to the present invention can obtain an input current twice that obtained by the receiver circuits of Related Art 1 and Non-Patent Literature 1. Therefore, more highly sensitive detection can be achieved. With use of the transmission protocol in which a mark rate of 50% is guaranteed in a relatively short bit sequence, such as 8B10B or 64B66B, the charge drawing elements 26 may be dispensed with.

The same configuration as used in FIG. 5 with respect to Embodiment 1 may be used instead of connection between the pair of the light-receiving elements in this embodiment.

(Embodiment 4)

Figure 10:
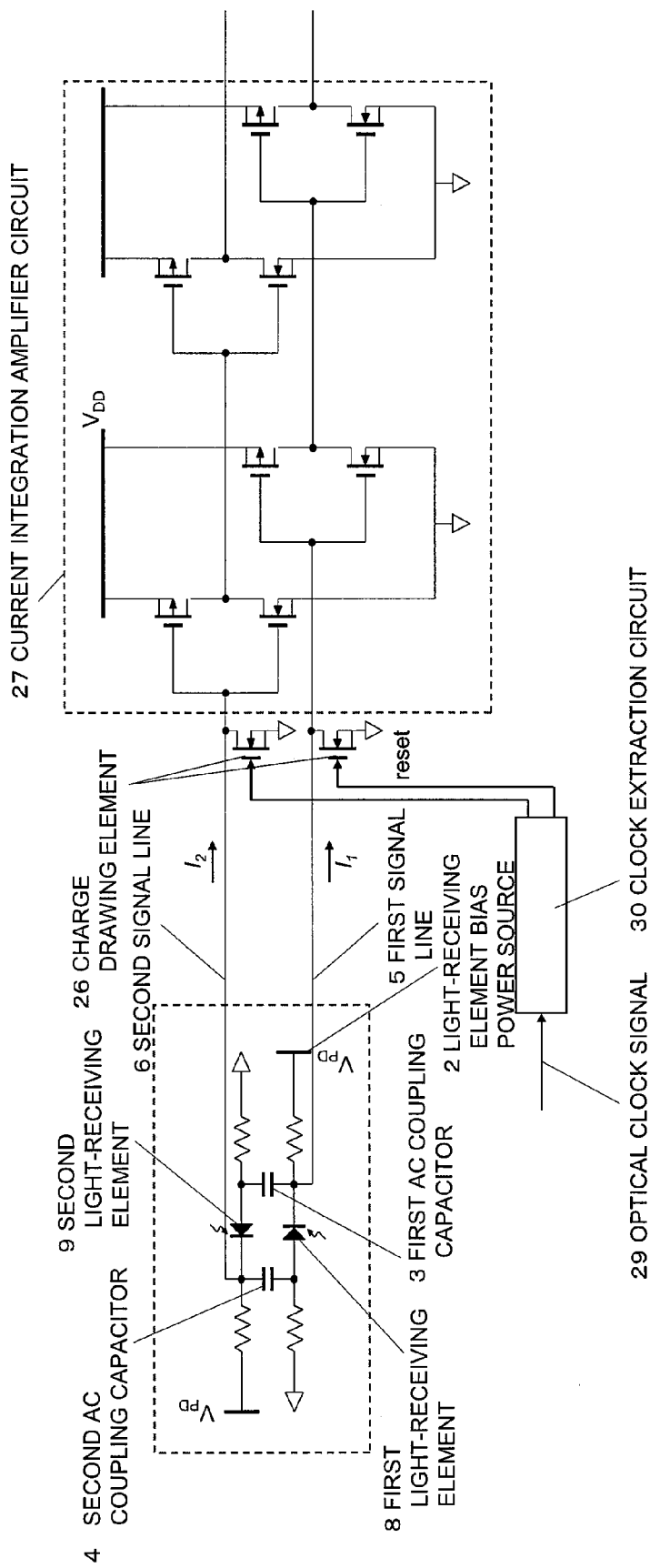
FIG. 10 is an optical receiver circuit diagram according to a fourth embodiment of the present invention.

FIG. 10 shows an optical receiver circuit according to a fourth embodiment of the present invention. In this embodiment, the same connection as described in Embodiment 3 is used between a pair of light-receiving elements. Furthermore, a current integration amplifier circuit 27 is used as with Embodiment 3. In this embodiment, optical clock signals 29 synchronized with data signals are transmitted through another optical transmission line. A clock extraction circuit 30 is used to conduct a reset operation of integration charges at proper timing. Only one transmission line is required for optical clock signals even if signal transmission is performed with multiple channels. Therefore, a highly sensitive optical receiver circuit can be configured without a considerably increased area.

The same configuration as used in FIG. 5 with respect to Embodiment 1 may be used instead of connection between the pair of the light-receiving elements in this embodiment.

(Embodiment 5)

Figure 11:
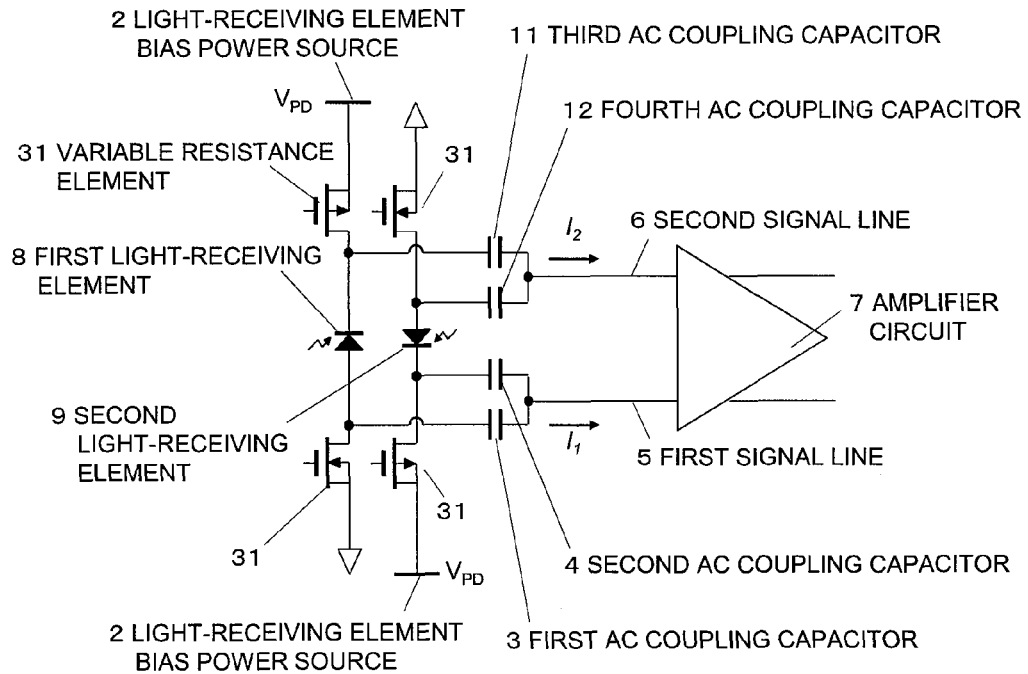
FIG. 11 is an optical receiver circuit diagram according to a fifth embodiment of the present invention.

FIG. 11 shows an optical receiver circuit according to a fifth embodiment of the present invention. In this embodiment, a bias voltage is applied to a first light-receiving element 8 and a second light-receiving element 9 by the use of variable resistance elements 31. MOSFETs may be used as the variable resistance elements 31, so that resistances can be set at optimal values by controlling gate voltages. Furthermore, before data transmission is conducted, negotiation is conducted between the optical receiver circuit according to the present invention and an optical transmitter circuit to set resistance values of the variable resistance elements 31 so as to cancel variations in characteristics of the light-receiving elements. Thus, a symmetric differential operation can be obtained.

(Embodiment 6)

Figure 12:
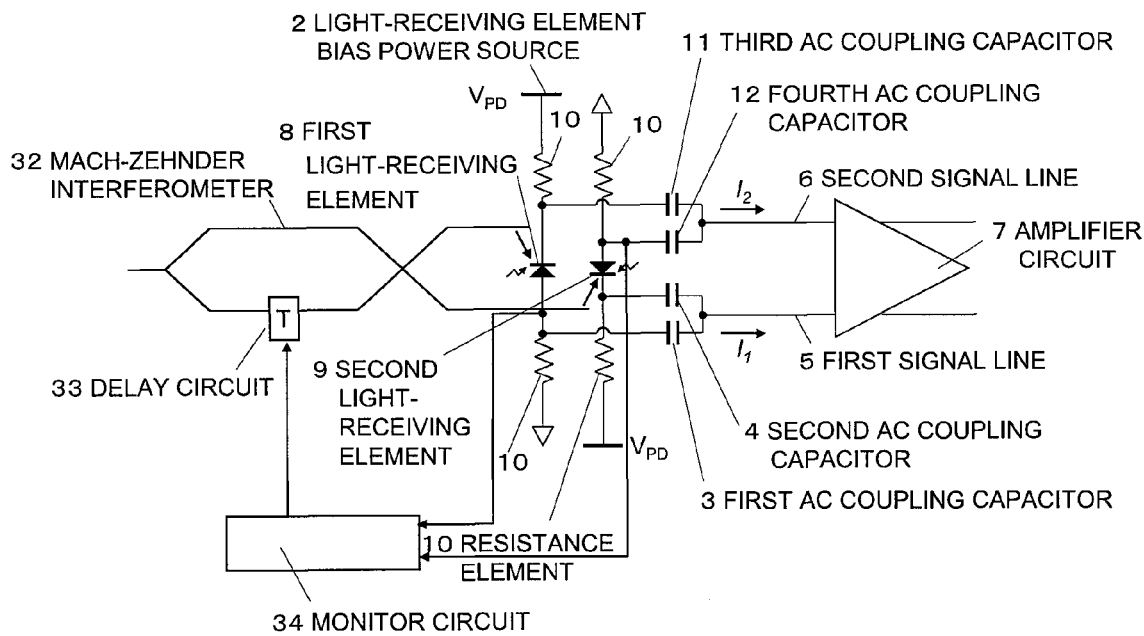
FIG. 12 is an optical receiver circuit diagram according to a sixth embodiment of the present invention.

FIG. 12 shows an optical receiver circuit according to a sixth embodiment of the present invention. In this embodiment, phase modulation signals are transmitted through one optical transmission line as with the DPSK (Differential Phase Shift Keying) method. Differential optical signals are generated with a Mach-Zehnder interferometer 32 and a delay circuit 33 on a receiver circuit, and signals are received by two light-receiving elements. At that time, DC levels are detected between the two light-receiving elements by a monitor circuit 34. Thus, delay time can be adjusted by feedback control so as to minimize the difference of the DC levels.

(Embodiment 7)

Figure 13:
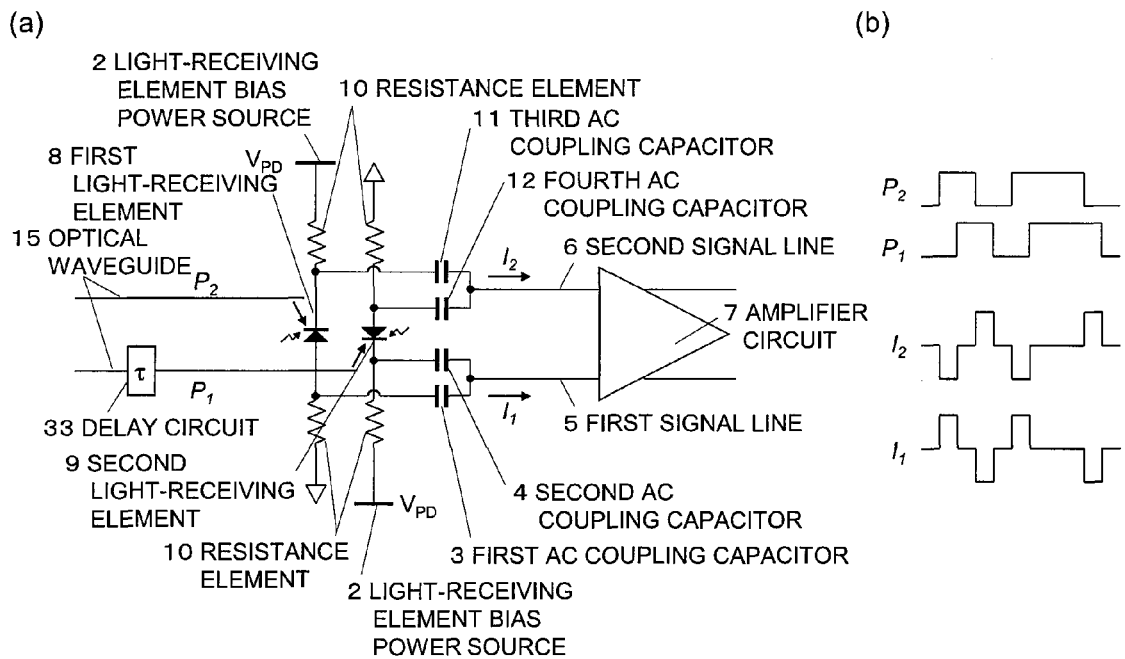
FIG. 13 relates to a seventh embodiment of the present invention, (a) being an optical receiver circuit diagram, (b) being a waveform chart.

FIG. 13 shows an optical receiver circuit according to a seventh embodiment of the present invention. In this embodiment, a delay circuit 33 is provided on one of two optical waveguides 15 for transmitting optical signals having the same phase. Low-frequency components of signal waveforms are suppressed, and high-frequency components are emphasized. For example, when delay time corresponding to 0.5 bit is applied, the same effect as obtained by an electrical signal emphasis process can advantageously be obtained.

(Embodiment 8)

Figure 14:
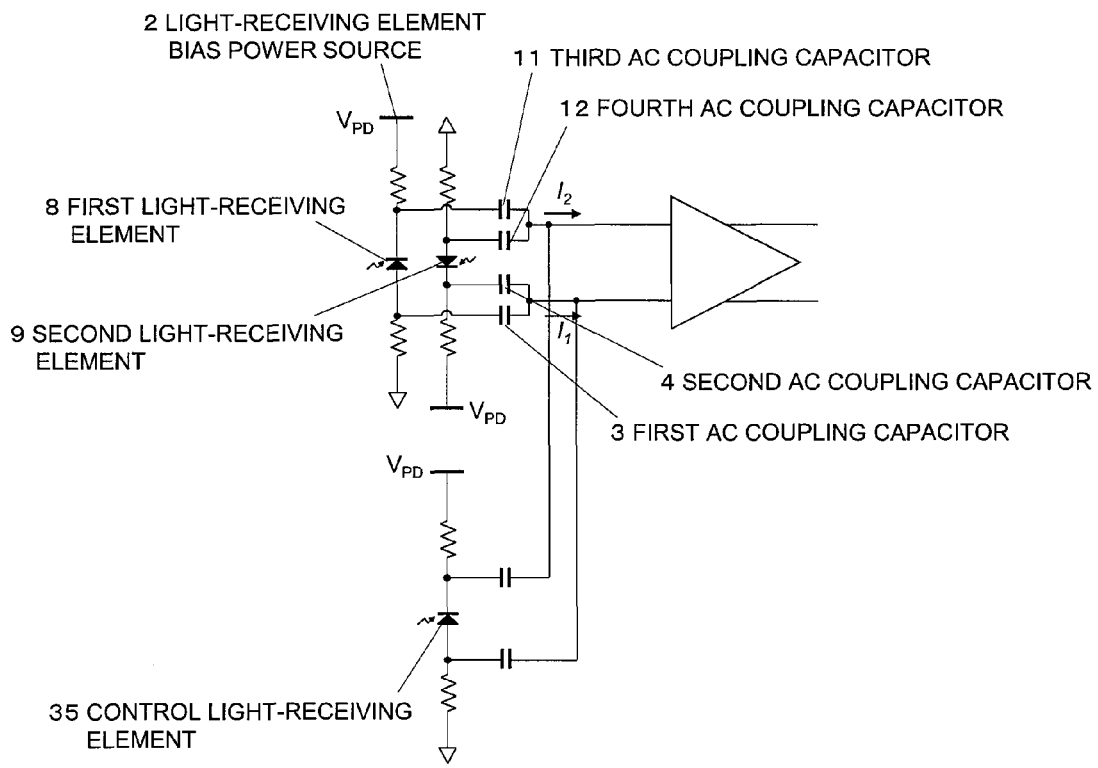
FIG. 14 is an optical receiver circuit diagram according to an eighth embodiment of the present invention.

FIG. 14 shows an optical receiver circuit according to an eighth embodiment of the present invention. In this embodiment, a control light-receiving element 35 is added via AC coupling capacitors. When an optical signal is inputted to the control light-receiving element 35, this optical receiver circuit is advantageous in that rising/falling portions or edges of waveforms can be emphasized or a DC level can be dynamically adjusted for consecutive 0/1 signals.

As described above, the optical receiver circuit according to embodiments of the present invention couples terminals of a first light-receiving element and a second light-receiving element of reversed polarities to each other via an AC coupling capacitor. When differential optical signals are inputted to the first light-receiving element and the second light-receiving element, differential signal currents are generated in the first signal line and the second signal line. Thus, the present embodiment can obtain a differential amplitude twice that obtained by the receiver circuits of Related Art 1 and Non-Patent Literature 1. Therefore, a highly sensitive optical receiver circuit can advantageously be implemented.

Although the present invention has been described along with some embodiments, the present invention is not limited to the aforementioned embodiments. Thus, as a matter of course, the present invention includes various variations and modifications that can be made within the scope of the present invention by those skilled in the art.

Figure 3:
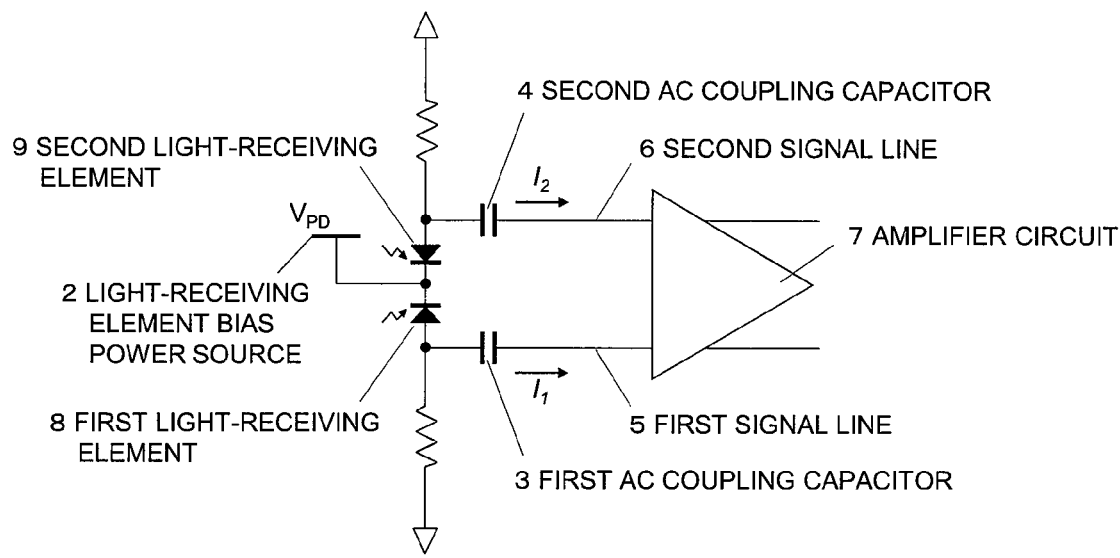
FIG. 3 shows an optical receiver circuit of Non-Patent Literature 1.
Figure 4:
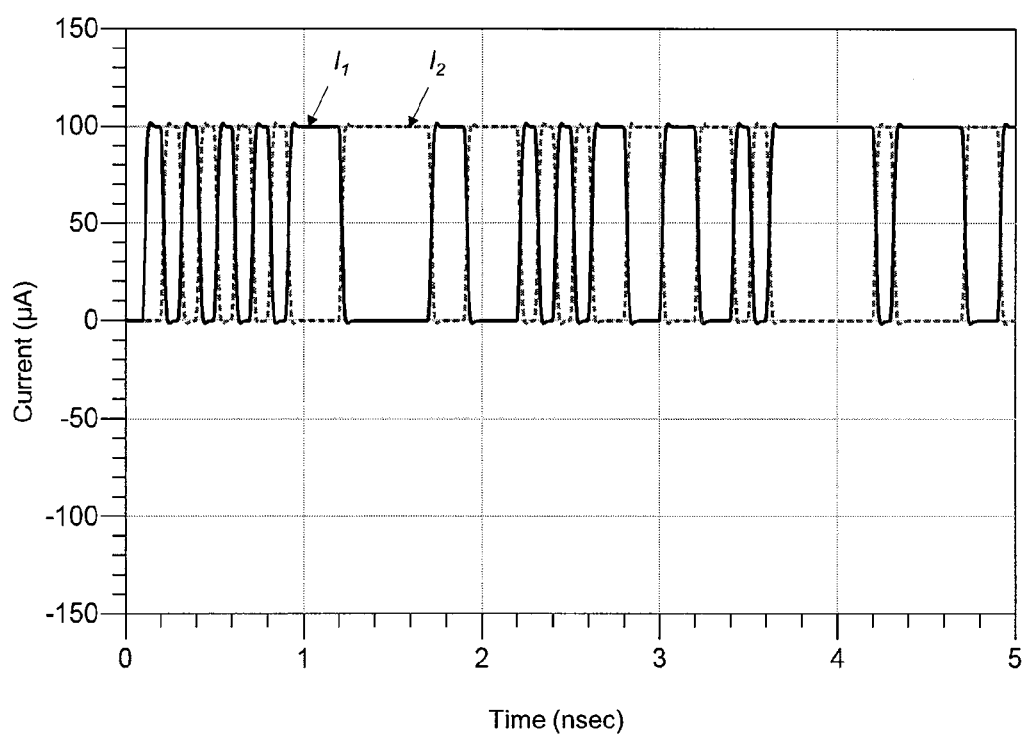
FIG. 4 is a diagram showing an example of waveforms of the optical receiver circuit shown in FIG. 3.

While the present invention has been described along with some embodiments, the present invention is not limited to the above embodiments. For example, the first signal line and the second signal line illustrated in FIG. 3 may be coupled to the current integration amplifier circuit 27 illustrated in FIG. 9 or 10, rather than coupled to the amplifier circuit 7. Similarly, the first signal line and the second signal line illustrated in FIG. 1 may be coupled to the amplifier circuit 7. Thus, it is needless to say that the present invention includes various variations and modifications that can be made within the scope of the present invention by those skilled in the art.

This application claims the benefit of priority from Japanese patent application No. 2013-065997, filed on Mar. 27, 2013, the disclosure of which is incorporated herein in its entirety by reference.

DESCRIPTION OF REFERENCE NUMERALS AND SIGNS 1 light-receiving element
2 light-receiving element bias power source
3 first AC coupling capacitor
4 second AC coupling capacitor
5 first signal line
6 second signal line
7 amplifier circuit
8 first light-receiving element
9 second light-receiving element
10 resistance element
11 third AC coupling capacitor
12 fourth AC coupling capacitor
13 first three-layer capacitor
14 second three-layer capacitor
15 optical waveguide
16 first differential optical signal
17 second differential optical signal
18 semiconductor substrate
19 embedment oxide layer
20 P-type semiconductor
21 P-type electrode
22 N-type semiconductor
23 N-type electrode
24 i-type optical absorber layer
25 capacitor intermediate electrode layer
26 charge drawing element
27 current integration amplifier circuit
28 control circuit
29 optical clock signal
30 clock extraction circuit
31 variable resistance element
32 Mach-Zehnder interferometer
33 delay circuit
34 monitor circuit
35 control light-receiving element

The invention claimed is:

1. An optical receiver circuit having a function of converting a differential optical signal into a differential current signal, comprising:
a pair of light-receiving elements including first and second light-receiving elements configured to convert an optical signal into a current signal sent to a pair of signal lines,
wherein an anode of the first light-receiving element and a cathode of the second light-receiving element are connected to a first signal line of the pair of signal lines via first and second AC coupling capacitors, respectively,
wherein a cathode of the first light-receiving element and an anode of the second light-receiving element are connected to a second signal line of the pair of signal lines via third and fourth AC coupling capacitors, respectively, wherein differential signal currents are generated in the first and second signal lines in response to reception of differential optical signals inputted into the first and second light-receiving elements, wherein the first capacitor and the second capacitor are formed by a first three-layer capacitor having three electrodes in a stacking direction, wherein the third capacitor and the fourth capacitor are formed by a second three-layer capacitor having three electrodes in a stacking direction, and wherein intermediate electrodes of the first and second three-layer capacitors are connected to the first signal line and the second signal line, respectively.

2. The optical receiver circuit as recited in claim 1, wherein the pair of light-receiving elements, a pair of three-layer capacitors including the first and second three-layer capacitors, and the pair of signal lines including the first signal line and the second signal line are symmetrically arranged such that symmetric differential signal currents are obtained in the pair of signal lines, and a signal line connected to the intermediate electrode layers of the first and second three-layer capacitors is drawn in a direction perpendicular to an optical waveguide.

3. The optical receiver circuit as recited in claim 1, including a plurality of pairs of light-receiving elements including the pair of light-receiving elements, the plurality of pairs of light-receiving elements having a sensitivity in different wavelength ranges, and a switch configured to switch an optical input path depending upon a wavelength of input light and selecting one of the plurality of pairs of light-receiving elements into which the differential optical signals are inputted.

4. The optical receiver circuit as recited in claim 1, further comprising:
an amplifier circuit operable for the differential current signals.

5. The optical receiver circuit as recited in claim 1, further comprising:
an amplifier circuit operable to accumulate electric charges in response to the differential current signals to integrate the differential currents to detect signals and a circuit configured to draw the integrated charges of the amplifier circuit with a signal of a control circuit for feeding back an output of the amplifier circuit or an optical clock signal so as to conduct a reset operation.

6. The optical receiver circuit as recited in claim 1, further comprising:
a differential optical signal generator formed by a Mach-Zehnder interferometer and an optical delay circuit;
a receiver configured to receive differential optical signals supplied from the differential optical signal generator by using the pair of light-receiving elements and to monitor direct current balance of the generated photoelectric currents; and
a controller configured to control delay time of the optical delay circuit with feedback control, wherein optical signals modulated in phase are converted into the differential current signals.

7. The optical receiver circuit as recited in claim 1, wherein an optical delay circuit is provided on one of two optical transmission lines for transmitting optical signals having the same phase, and the optical receiver circuit has a function of conducting an emphasis process of a signal current waveform in the pair of light-receiving elements.

8. The optical receiver circuit as recited in claim 1, further comprising:
control light-receiving elements connected to the first signal line and the second signal line, respectively, via AC coupling capacitors, wherein the optical receiver circuit has a function of shaping data signal waveforms received by the pair of light-receiving elements and/or adjusting direct current balance when control optical signals are inputted into the control light-receiving elements.

9. The optical receiver circuit as recited in claim 1, wherein the anodes of the first light-receiving element and the second light-receiving element are connected to a ground potential via resistance elements, respectively, and the cathodes of the first light-receiving element and the second light-receiving element are connected to a bias power source via resistance elements, respectively.

10. The optical receiver circuit as recited in claim 1, wherein the anodes of the first light-receiving element and the second light-receiving element are connected to a ground potential via variable resistance elements, respectively, and the cathodes of the first light-receiving element and the second light-receiving element are connected to a bias power source via variable resistance elements, respectively.

11. The optical receiver circuit as recited in claim 1, wherein the first, second, third, and fourth capacitors and the pair of light-receiving elements are formed on the same semiconductor substrate, and the first, second, third, and fourth capacitors have a function of reducing optical and electrical crosstalk.

12. An optical receiver circuit having a function of converting a differential optical signal into a differential current signal, comprising:
a pair of light-receiving elements including first and second light-receiving elements operable to convert an optical signal into a current signal sent to a pair of signal lines,
wherein a cathode of the first light-receiving element and an anode of the second light-receiving element are connected to each other via a first AC coupling capacitor,
wherein the cathode of the first light-receiving element is connected to a first signal line of the pair of signal lines,
wherein an anode of the first light-receiving element and a cathode of the second light-receiving element are connected to each other via a second AC coupling capacitor, and
wherein the cathode of the second light-receiving element is connected to a second signal line of the pair of signal lines, and differential signal currents are generated in the first and second signal lines in response to reception of differential optical signals inputted into the first and second light-receiving elements,
the optical receiver circuit including:
a plurality of pairs of light-receiving elements including the pair of light-receiving elements, the plurality of pairs of light-receiving elements having a sensitivity in different wavelength ranges, and a switch configured to switch an optical input path depending upon a wavelength of input light and selecting one of the plurality of pairs of light-receiving elements into which the differential optical signals are inputted.

13. The optical receiver circuit as recited in claim 12, further comprising:
an amplifier circuit operable to accumulate electric charges in response to the differential current signals to integrate the differential signal currents to detect signals and a circuit configured to draw the integrated charges of the amplifier circuit with a signal of a control circuit for feeding back an output of the amplifier circuit or an optical clock signal so as to conduct a reset operation.

14. The optical receiver circuit as recited in claim 12, further comprising:
   a differential optical signal generator formed by a Mach-Zehnder interferometer and an optical delay circuit;
   a receiver configured to receive differential optical signals supplied from the differential optical signal generator by using the pair of light-receiving elements and to monitor direct current balance of the generated photoelectric currents; and
   a controller configured to control delay time of the optical delay circuit with feedback control, wherein optical signals modulated in phase are converted into the differential current signals.

15. The optical receiver circuit as recited in claim 12, wherein an optical delay circuit is provided on one of two optical transmission lines for transmitting optical signals having the same phase, and the optical receiver circuit has a function of conducting an emphasis process of a signal current waveform in the pair of light-receiving elements.

16. The optical receiver circuit as recited in claim 12, further comprising:
   control light-receiving elements connected to the first signal line and the second signal line, respectively, via AC coupling capacitors, wherein the optical receiver circuit has a function of shaping data signal waveforms received by the pair of light-receiving elements and/or adjusting direct current balance when control optical signals are inputted into the control light-receiving elements.

17. The optical receiver circuit as recited in claim 12, wherein the anodes of the first light-receiving element and the second light-receiving element are connected to a ground potential via resistance elements, respectively, and the cathodes of the first light-receiving element and the second light-receiving element are connected to a bias power source via resistance elements, respectively.

18. The optical receiver circuit as recited in claim 12, wherein the anodes of the first light-receiving element and the second light-receiving element are connected to a ground potential via variable resistance elements, respectively, and the cathodes of the first light-receiving element and the second light-receiving element are connected to a bias power source via variable resistance elements, respectively.

\* \* \* \* \*